(12) United States Patent
Loewenhardt et al.

(10) Patent No.: US 6,356,097 B1
(45) Date of Patent: Mar. 12, 2002

(54) CAPACITIVE PROBE FOR IN SITU MEASUREMENT OF WAFER DC BIAS VOLTAGE

(75) Inventors: Peter K. Loewenhardt; Arthur Sato, both of San Jose; Valentin Todorov, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/361,649

(22) Filed: Jul. 27, 1999

Related U.S. Application Data

(63) Continuation-in-part of application No. 08/878,855, filed on Jun. 20, 1997, now Pat. No. 5,942,889.

(51) Int. Cl.⁷ .......................... G01R 1/04; G01R 31/26
(52) U.S. Cl. .................. 324/765; 324/750; 324/156
(58) Field of Search ................... 324/459, 750, 324/765, 156

(56) References Cited

U.S. PATENT DOCUMENTS

| | | | | |
|---|---|---|---|---|
| 3,796,955 A | * | 3/1974 | Bhattacharyya et al. | 324/769 |
| 4,358,686 A | | 11/1982 | Kinoshita | 250/492.2 |
| 4,859,908 A | | 8/1989 | Yoshida et al. | 315/111.81 |
| 5,451,884 A | | 9/1995 | Sauerland | 324/760 |
| 5,557,215 A | | 9/1996 | Saeki et al. | 324/765 |
| 5,570,031 A | * | 10/1996 | Sasaki et al. | 324/750 |
| 5,584,938 A | * | 12/1996 | Douglas | 324/464 X |
| 5,667,701 A | | 9/1997 | Sato et al. | 438/17 X |
| 5,810,963 A | | 9/1998 | Tomioka | 438/17 X |

* cited by examiner

Primary Examiner—Glenn W. Brown
(74) Attorney, Agent, or Firm—Moser Patterson & Sheridan

(57) ABSTRACT

A method and apparatus for estimating voltage on a wafer located in a process chamber. A probe, embedded in a wall of the process chamber, detects voltage levels generated by a plasma within the process chamber. A relationship between the detected plasma voltage level and the wafer voltage is determined.

32 Claims, 7 Drawing Sheets

CAPACITIVE PROBE FOR IN SITU MEASUREMENT OF WAFER DC BIAS VOLTAGE

REFERENCE TO CO-PENDING UNITED STATES PATENT APPLICATION

This application is a continuation-in-part of U.S. patent application Ser. No. 08/878,855, filed Jun. 20, 1997 now U.S. Pat. No. 5,942,889.

BACKGROUND OF THE INVENTION

1. Field of the Invention

The invention relates generally to diagnostic instrumentation for semiconductor wafer processing equipment and, more specifically, to a capacitive probe for in situ measurement of the DC bias voltage accumulated on a semiconductor wafer while being processed in a semiconductor wafer processing system.

2. Description of the Background Art

When monitoring semiconductor wafer processing systems, it is important to accurately measure the DC bias voltage on the wafer. One method of measuring this value is with DC bias "plugs". For example, in the P5000 metal etch chamber, manufactured by Applied Materials of Santa Clara, Calif., DC pickups or "plugs" composed of a graphite or solid silicon carbide shaft are placed in direct contact with a plasma. Assuming a near zero potential drop across the plasma, it is possible to estimate the DC bias on the wafer. Unfortunately, these types of "plugs" degrade and represent a consumable material that increases the maintenance costs of the chamber. Additionally, as the "plugs" are consumed, contaminants are released into the processing environment. As such, replacing the "plugs" with a device that measures DC bias voltage without directly contacting the plasma is preferred.

An improved measurement technique is to measure the amplitude of the RF voltage (e.g., peak-to-peak voltage) at the pedestal and assume the wafer is at the same potential. The measurement of this value is rectified to estimate the DC bias on the wafer. However, this solution proves to be inaccurate because of the high level of RF noise proximate the pedestal assembly that penetrates into the electrical measuring circuitry. Additionally, this technique requires substantial modification of the chamber to facilitate coupling a probe and its associated circuitry to the pedestal.

Therefore, there exists a need for a device that can estimate DC bias voltage at a wafer during processing without experiencing the limiting and erroneous effects of RF noise and/or physical degradation of voltage probes that contact the plasma.

SUMMARY OF THE INVENTION

The disadvantages heretofore associated with the prior art are overcome by an inventive probe for measuring voltage on a wafer located in a process chamber. The inventive probe comprises a conductive member embedded in a dielectric material. The dielectric material is in contact with a wall of the process chamber and exposed to the interior of the chamber. The dielectric material can be quartz, alumina and the like. The probe has an electrode fabricated from a conductive material, preferably a metal such as copper. The probe has a conductor that can coupled to a measuring instrument, such as a voltmeter, for measuring the voltage levels detected by the conductive member.

The inventive probe in one embodiment utilizes conductive member, i.e., an electrode, embedded in an outside wall of the chamber, e.g., mounted in a quartz window in the chamber wall. From such a location, the electrode receives the RF voltage oscillations of the plasma and couples these voltage oscillations to measuring equipment. By making certain circuit analysis assumptions, the value coupled to the measuring equipment represents an estimated DC bias voltage on the wafer. Such a probe configuration enjoys the advantage of low noise levels for good signal accuracy, no particle generation and can be easily adapted into systems currently in use.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
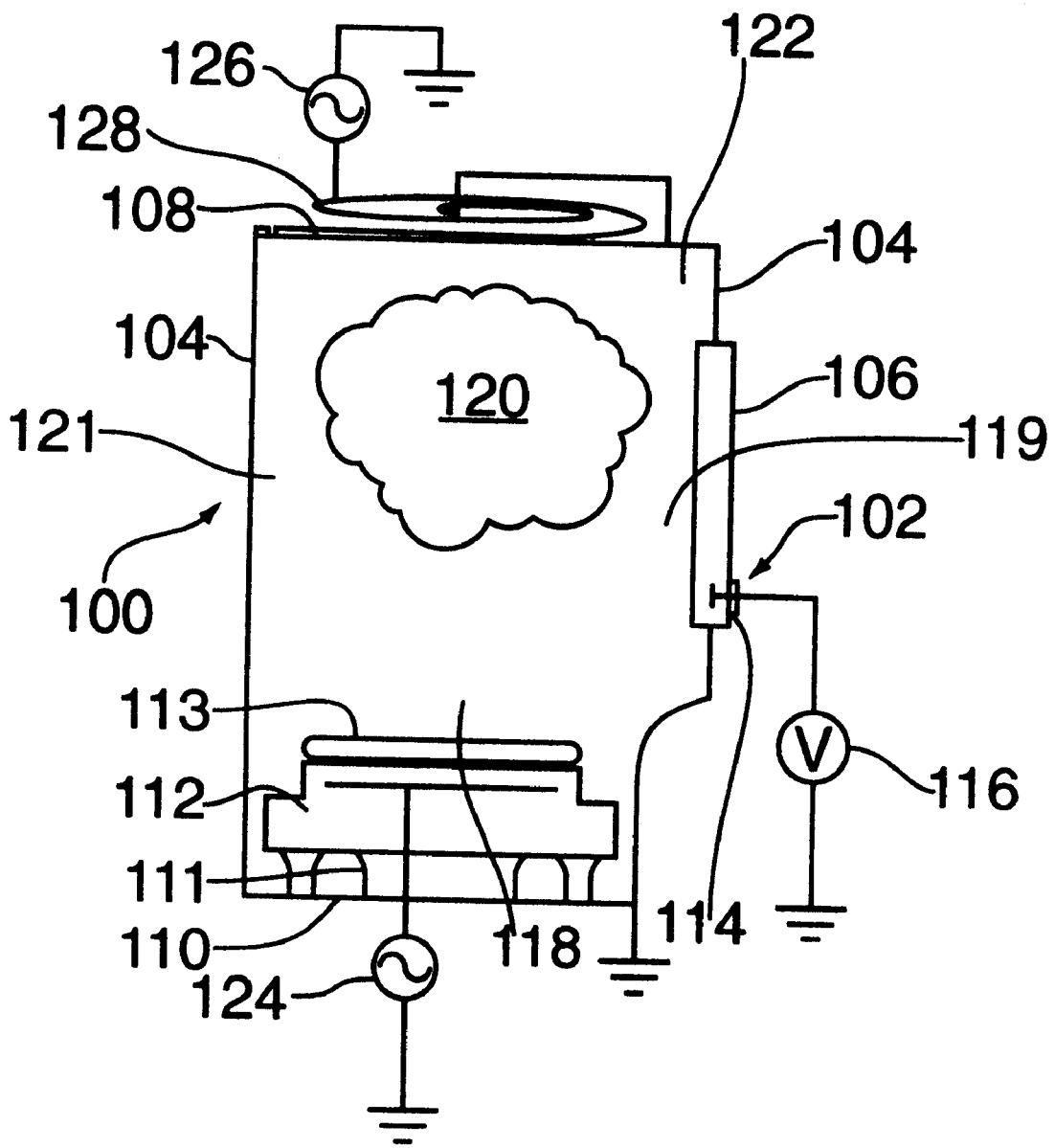
FIG. 1 is a simplified cross-sectional view of a wafer processing chamber with the inventive probe incorporated therein.

FIG. 1 depicts a simplified cross-sectional view of a plasma reaction chamber 100 with an inventive probe 102 attached thereto. For a detailed understanding of the plasma reaction chamber and its operation in processing the wafer, the reader should refer to the drawings and the detailed description contained in U.S. Pat. No. 5,460,689, issued Oct. 24, 1995, incorporated herein by reference. That disclosure discloses a biased, high density plasma reaction chamber manufactured by Applied Materials, Inc. of Santa Clara, Calif.

Specifically, the plasma reaction chamber 100 has a sealed interior volume 122 defined by chamber walls 104, roof 108 and bottom 110. Disposed at the chamber bottom 110 is a pedestal 111 and a wafer support 112 (i.e., an electrostatic chuck). The wafer support 112, in turn, supports a wafer 113 which is to be processed. One or more power supplies are connected to the chamber 100 to ignite a plasma 120 and electrically bias the wafer 113 to optimize process conditions. For example, a first power supply 126 is connected to a coil 128 disposed above the chamber roof 108. The coil 128 capacitively couples power into the chamber 100 to ignite the plasma 120, which is then sustained by the inductive field. A second power supply 124 is connected to the wafer support 112 to bias the wafer 113.

Additionally, one of the walls 104 further comprises a window 106. The window 106 may be comprised of a suitable dielectric material, such as ceramics, plastics and the like. Quartz, alumina and Ultem™ (polyetherimide) are examples of good window materials. Preferably the window 106 is a sheet of quartz, approximately 0.635 cm thick. The window 106 may comprise multiple layers to facilitate embedding the probe 102 as described in greater detail below. Other methods of embedding the probe 102 within the window 106 which isolate the probe 102 from the interior volume 122 are equally acceptable. The probe 102 has an electrode 114 that is fabricated from electrically conductive material and is embedded in the window 106. The probe 102 is connected to a voltage measuring instrument 116 that is capable of measuring either AC (peak-to-peak) or DC (bias level) voltages.

In a typical plasma etching reaction chamber 100, a wafer 113 is supported by a wafer support 112. The wafer 113 is retained on the wafer support 112 by electrostatic clamping, or alternately by gravity or mechanical. To aid in the etching process, the plasma 120 is generated in the interior volume 122 of the chamber 100. Once the appropriate conditions are met, i.e., plasma ignited and sustained, temperature and pressure levels established, the wafer processing commences. As discussed above, monitoring and regulating DC wafer bias ensures a good end product, i.e., a wafer with a high yield area and few defects. The inventive probe 102 measures voltage levels that are proportional to the DC bias voltage level on the wafer 113 without physically contacting the plasma 120 thereby minimizing the degradation, replacement needs, and particulate generation associated with convention "plugs".

Specifically, the electrode 114 is capable of transmitting electric currents received through the window 106 to the voltage measuring instrument 116. These electric currents are induced by fluctuations in the voltage level of the plasma 120. The fluctuations are the result of the oscillations of the RF power coupled to the wafer support 112 inducing a corresponding oscillation in the plasma potential. Therefore, a reading on the voltage measuring instrument 116 is proportional to a peak-to-peak voltage on the wafer 113. This peak-to-peak voltage correlates to the DC bias voltage on the wafer 113.

Figure 2A:
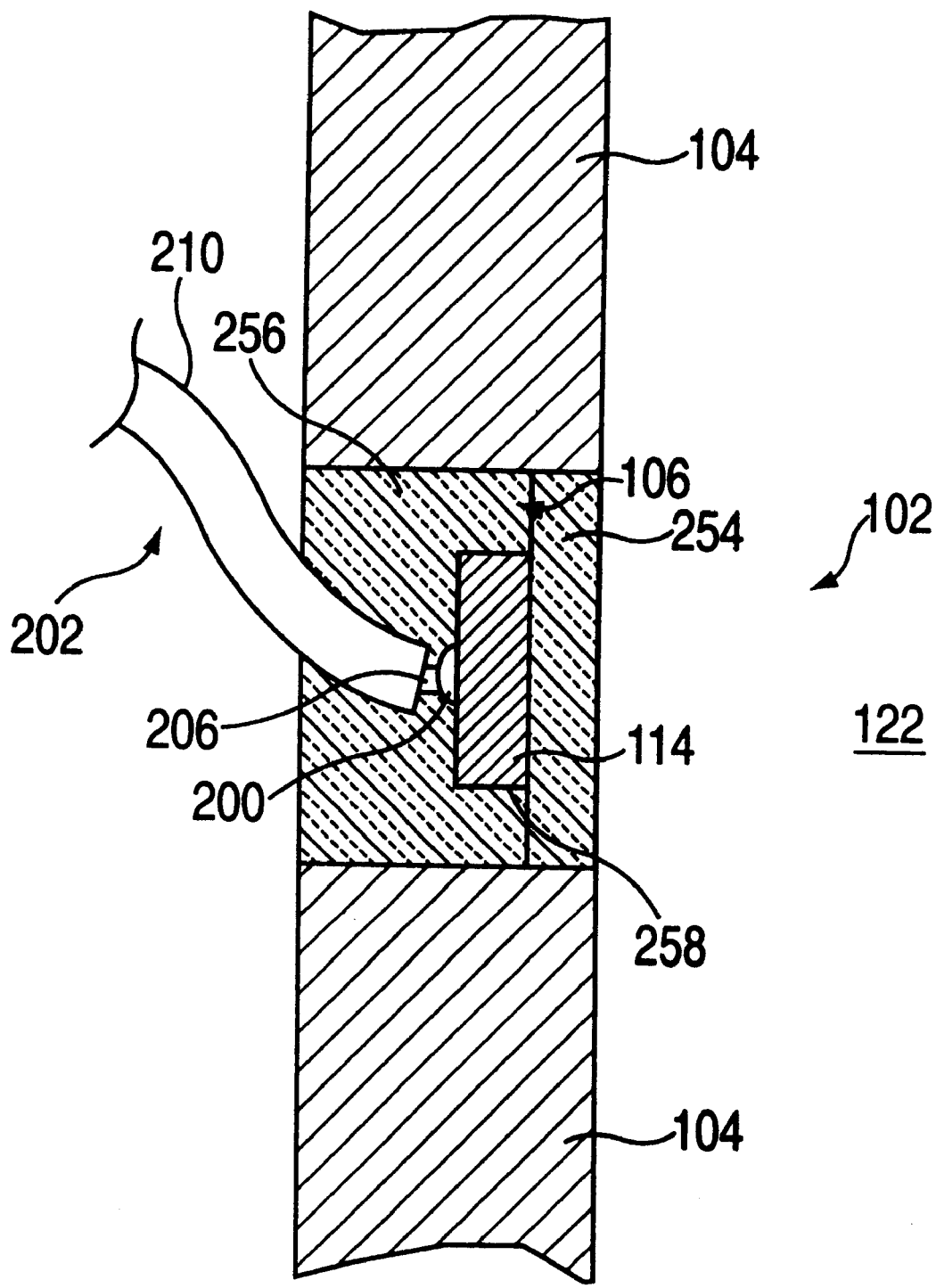
FIG. 2A is a cross-sectional view of the inventive probe and portion of the processing chamber of FIG. 1.

More specifically, FIG. 2A depicts a cross-sectional view of the probe 102. The probe 102 comprises the electrode 114 with a length of coaxial cable 202. A center conductor 206 of the coaxial cable 202 is soldered to the electrode 114 using solder 200. Alternately, other conventional methods of electrical attachment can be readily substituted for the solder 200, such as crimping and the like. An outer shield 210 of the coaxial cable 202 is connected to ground via the voltage measuring instrument 116. The probe 102 is physically embedded in the window 106 so that the electrode 114 is insulated from both the wall 104 and the interior volume 122 (i.e., the plasma 120 of FIG. 1).

Preferably, the electrode 114 is a 0.25 inch diameter conductive foil (i.e., metal) sandwiched between a first layer 256 of quartz fused to a second layer 254 of quartz. The first layer 256 may optionally comprise a depression 258 to house the electrode 114 and permit the first layer 256 to lay flush against the second layer 254. The electrode 114 may alternately be sputtered into the depression 258 of the first layer 256. Although the size of the electrode 114 has been illustratively disclosed as a 0.25 inch diameter conductive foil, preferably copper, the size electrode 114 will depend upon the impedance of the probe 102 and wall 104, the window material, and the distance between the electrode 114 and interior volume 122.

Figure 2B:
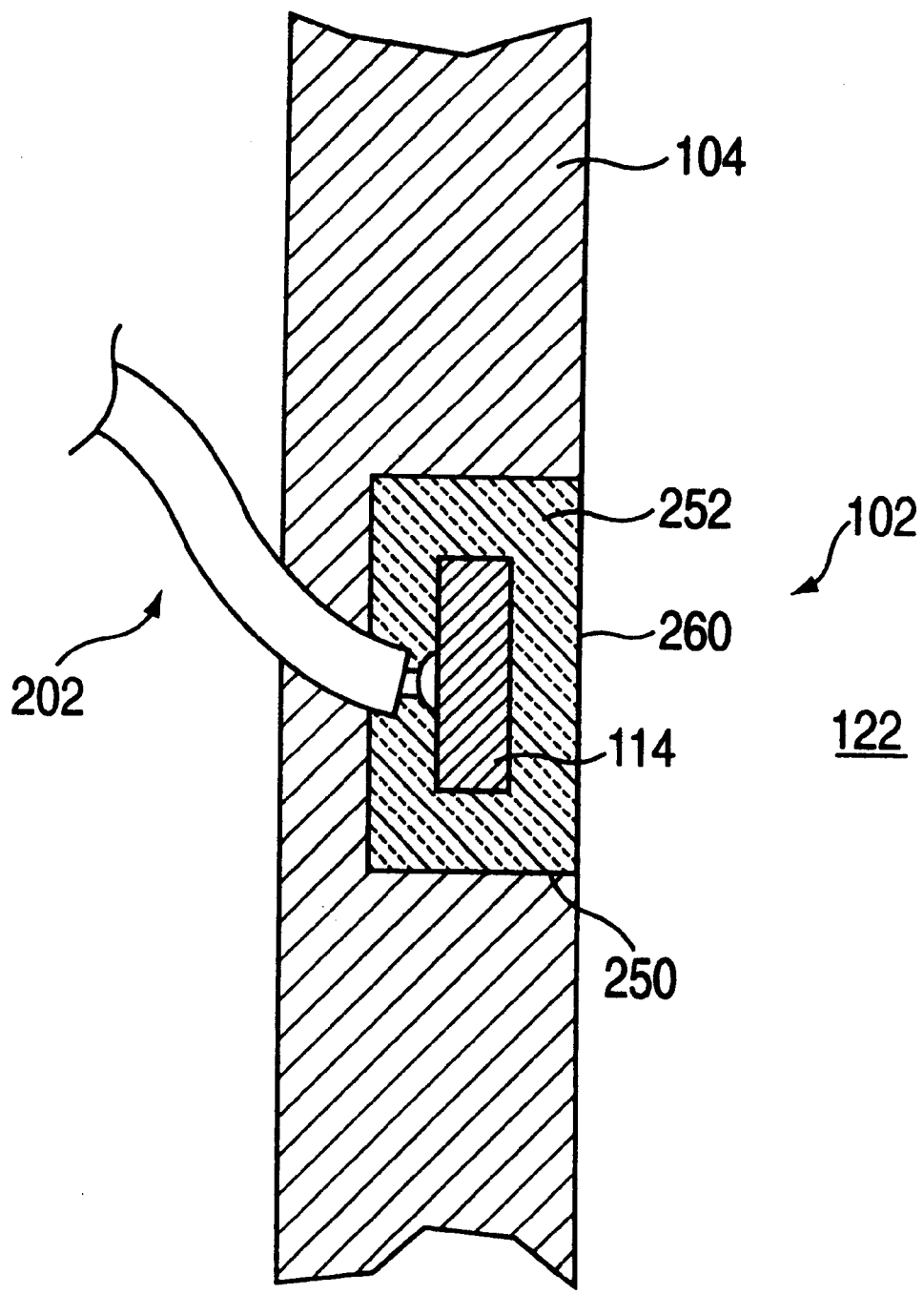
FIG. 2B is a cross-sectional view of an alternate embodiment of the inventive probe of FIG. 1.

In an alternate embodiment of the invention as depicted in FIG. 2B, the probe 102 is mounted in a bore 250 in the wall 104. The bore 250 is open to the internal volume 122 and is substantially filled with a dielectric material 252, such as a ceramic, that encapsulates the electrode 114. However, other types of material may be used to encapsulate the electrode 114 and may be selected from the group consisting of quartz, alumina, Ultem™ (polyetherimide) and the like. A portion 260 of the dielectric material 252 separates the electrode 114 from the interior volume 122. The depth of the bore 250 needs only be great enough to facilitate the encapsulation of the electrode 114.

Figure 2C:
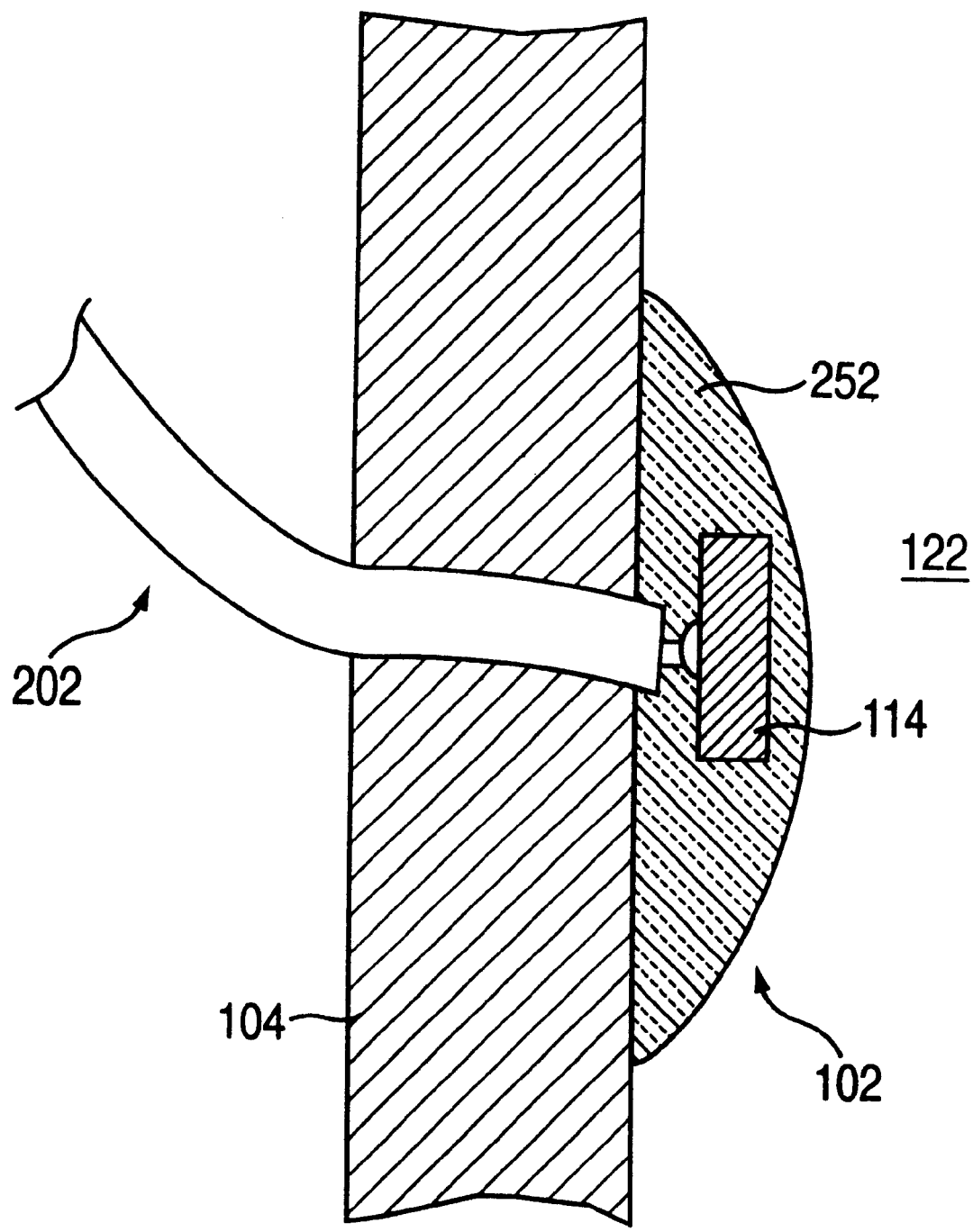
FIG. 2C is a cross-sectional view of another alternate embodiment of the inventive probe of FIG. 1.

Another embodiment of the probe 102 is depicted in FIG. 2C. The probe 102 has an electrode 114 encapsulated in a dielectric material 252. The dielectric material 252 is disposed on wall 104 and is exposed to the interior volume 122.

Figure 3:
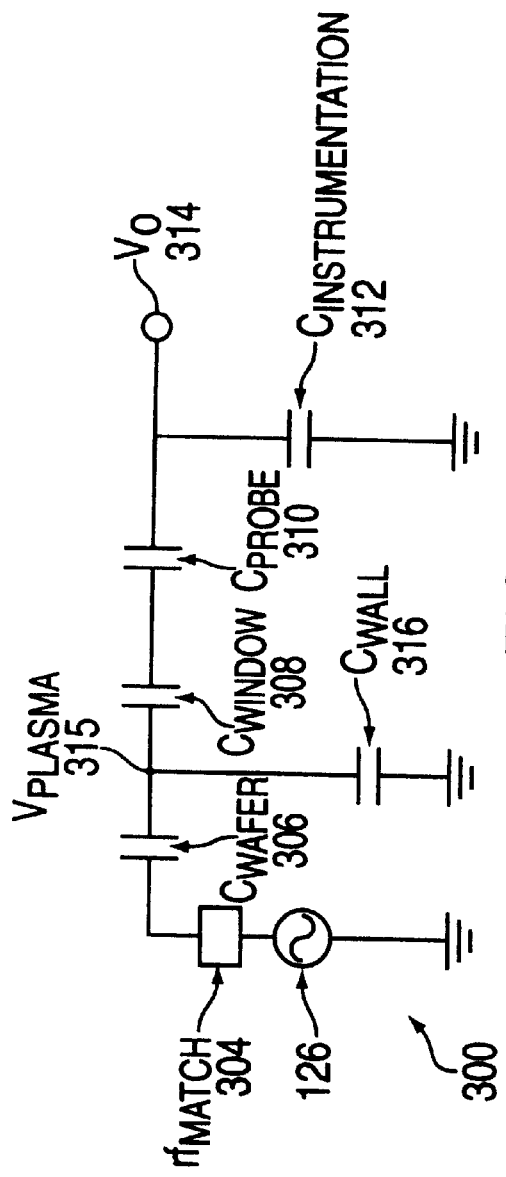
FIG. 3 is a schematic diagram of the representative voltage divider circuit of the inventive probe.
Figure 4:
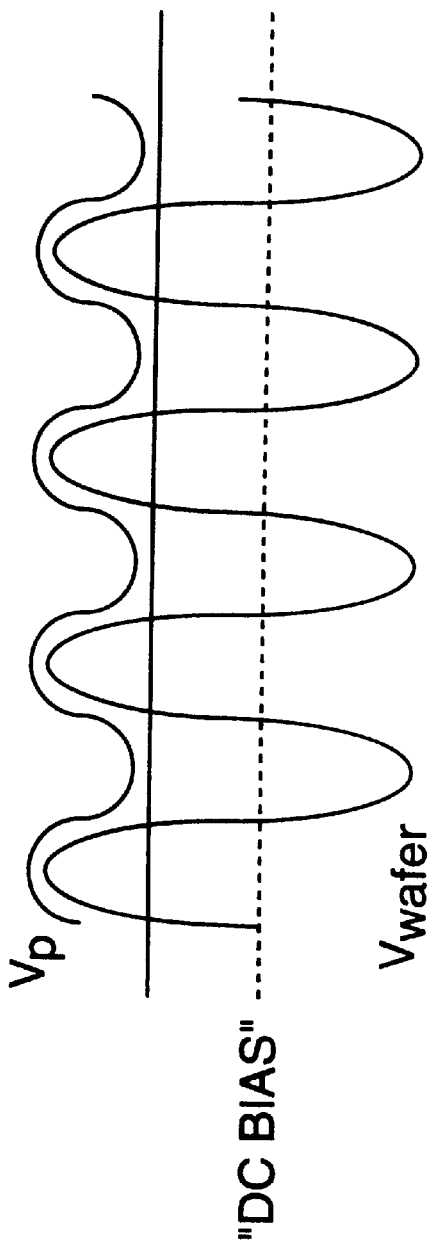
FIG. 4 is a graphical representation of the wafer and plasma voltage oscillations and DC biasing level on the wafer.

The schematic diagram of FIG. 3 depicts a voltage divider circuit 300 that approximates the physical interaction of the elements in the chamber atmosphere with the probe 102. The RF source 302 and matching circuit 304 establish the necessary voltage waveform and impedance to execute the etching process conducted in the chamber. A capacitance exists between the wafer 113 and the plasma 120, across a first plasma sheath 118, which is represented by the capacitor $C_{wafer}$ 306. A second capacitance exists between the plasma 120 and the chamber wall 104, across a second plasma sheath 121 which is represented by the capacitor $C_{wall}$ 316. A third capacitance exists between the plasma 120 and the quartz window 106, across a third plasma sheath 119 and is represented by $C_{window}$ 308 (this third capacitance $C_{window}$ 308 exists between the plasma 120 and the portion of the dielectric 254 when using the alternate embodiment of the probe 102 depicted in FIG. 2B). A fourth capacitance exists across the quartz window 106 from the inside surface that contacts the sheath 119 to the electrode 114. This capacitance is represented by $C_{probe}$ 310. A final capacitance $C_{instrumentation}$ 312 represents the capacitance in the voltage measuring instrument 116.

As configured, the circuit in FIG. 3 is linear and can be analyzed to approximate a reading of the rf voltage $V_{wafer}$ across the plasma sheath 118 represented by $C_{wafer}$ 306. Circuit analysis begins with the assumption that the rf current injected into the chamber 100 by the rf source 302 flows primarily through capacitances $C_{wafer}$ 306 and $C_{wall}$ 316. The branch of the circuit that contains the probe (represented by $C_{probe}$) draws very little current and is present only to sense the plasma potential $V_{plasma}$ at node 315. The amount of current that flows through the probe is controlled by $C_{probe}$. Thus, when $C_{probe}$ is much smaller than $C_{wall}$, the current flowing through the probe branch of the circuit is negligible compared to the total current flowing through $C_{wall}$. Thus the electrode 114 size must be selected so that the impedance of the electrode 114 is greater than the impedance of the wall 104. Since almost all of the current flows in series through $C_{wafer}$ 306 and $C_{wall}$ 316, the voltage $V_{wafer}$ across $C_{wafer}$ 306 is related to the voltage across $C_{wall}$ 316 (which is by definition the plasma potential $V_{plasma}$) by the following relation:

$$V_{wafer} = \frac{C_{wall}}{C_{wafer}} \times V_{plasma}$$

Thus, if the proportionality constant can be deduced, the voltage across the sheath can be monitored at the wafer by monitoring the plasma potential.

$V_{plasma}$ is measured with the sensing circuit comprising capacitors $C_{window}$ 308, $C_{probe}$ 310, and $C_{instrumentaion}$ 312.

The output voltage $V_o$ at node 314 is related to $V_{plasma}$ by the following equation:

$$V_0 = \frac{\frac{1}{C_{instrumentation}}}{\frac{1}{C_{instrumentation}} + \frac{1}{C_{window}} + \frac{1}{C_{probe}}} \times V_{plasma}$$

By design, $C_{instrumentation}$ 312 and $C_{probe}$ 310 are chosen to be small, such that $$\frac{1}{C_{window}} \ll \frac{1}{C_{instrumentation}} + \frac{1}{C_{probe}}$$

Since any capacitance scales as C κ*A/d (where A is the area of the capacitor electrodes, κ is the dielectric constant of the window material, (e.g., quartz) and d is the spacing between the electrodes), the above relation can be achieved simply by choosing the thickness of the window between the electrode and interior volume to be much greater than the thickness of the plasma sheath at the window:

$$\frac{d_{quartz}}{\kappa_{quartz}} \gg d_{windowsheath}$$

Using the above expressions, the relation between $V_o$ and $V_{plasma}$ can be simplified to:

$$V_0 = \frac{1}{1 + \frac{C_{instrumentation}}{C_{probe}}} \times V_{plasma}$$

The ratio between $V_o$ and $V_{plasma}$ depends only on known quantities that are easily controlled. Combining the two foregoing equations that relate $V_{wafer}$, $V_{plasma}$, and $V_o$ results in the final relation between the output voltage $V_o$ and $V_{wafer}$:

$$V_{wafer} = \frac{C_{wall}}{C_{wafer}} \times \left(1 + \frac{C_{instrumentation}}{C_{probe}}\right) \times V_0$$

In actual practice, an experimental calibration is performed to find the proportionality constant between $V_o$ and $V_{wafer}$. The assumptions made during the circuit analysis make it possible to expect a linear response. Specifically, peak-to-peak voltage at the probe is proportional to peak-to-peak voltage at the wafer. Since the relationship between peak-to-peak wafer voltage and wafer DC bias is known, peak-to-peak voltage at the probe can be related to DC bias voltage at the wafer. It is known that there is, in general, an offset between the peak to peak voltage and the DC bias of the form $V_{DCbias} = aV_{peak-to-peak} + b$ where b is a constant. Empirical data collected using different source voltage levels (the RF source voltage 302, $V_s$) yields a constant that relates $V_o$ to the wafer voltage.

Figure 5:
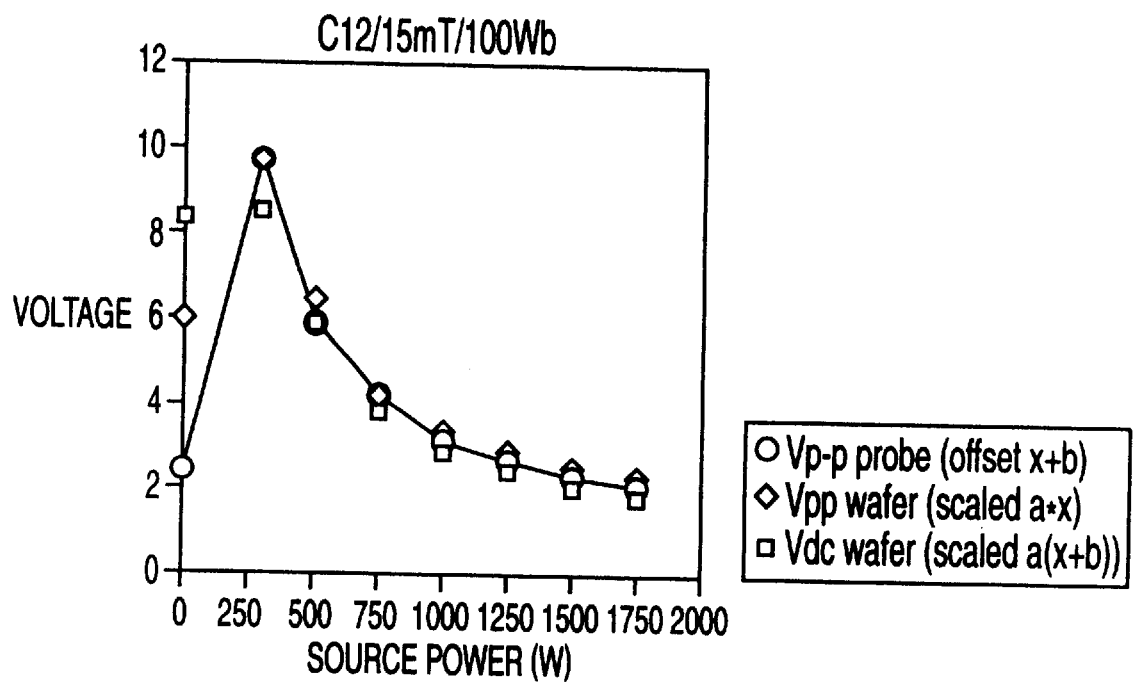
FIG. 5 is a graph of scaled voltage values vs. source power.
Figure 6:
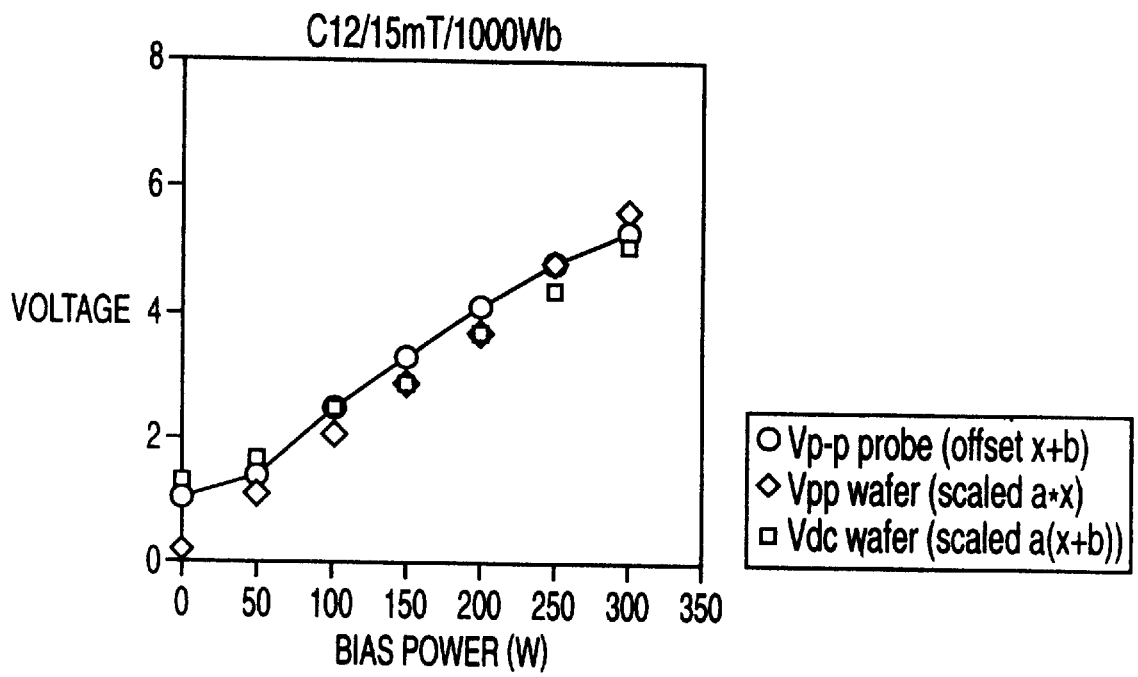
FIG. 6 is a graph of scaled voltage values vs. bias power.
Figure 7:
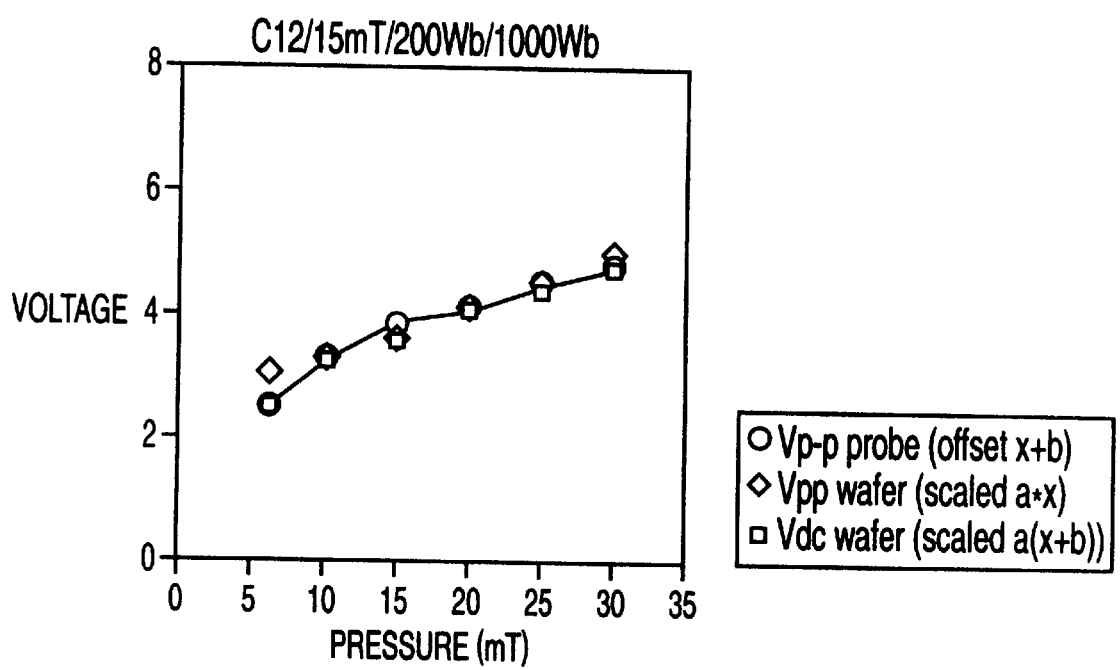
FIG. 7 is a graph of scaled voltage values vs. pressure.

For example, FIG. 5 is a graph of peak-to-peak voltage values measured at the probe (black dots) and wafer (white diamonds) and the DC voltage at the wafer (black square) vs. RF source power. FIG. 6 is a graph of the same voltage values vs. DC bias power and FIG. 7 is a graph of the same voltage values vs. chamber pressure. The voltage values have been scaled for easy comparison of the graphs. In each case, the voltages follow a nearly linear path as the power levels or chamber pressure is increased. As such, the assumptions are supported by the test data and the voltage divider analysis becomes an accurate method of estimating wafer DC bias levels.

The greatest advantage realized by the subject invention is its ability to measure the required data using a probe 102 that is embedded the chamber. As such, there is no chance of signal degeneration caused by nearby transmission lines or RF noise due to proximity of a high voltage source. Additionally, any noise that is detected by the inventive probe may be eliminated by altering the size of electrode 114. The signal level viewed at the voltage measuring instrument 116 is proportional to the size of the electrode 114. Therefore, if substantial background noise is detected, the electrode size can be increased to improve the signal to noise ratio. In this way, the amount of voltage fluctuations received at the electrode 114 is increased in relation to the amount of noise which is assumed constant for a given frequency.

Although various embodiments which incorporate the teachings of the present invention have been shown and described in detail herein, those skilled in the art can readily devise many other varied embodiments that still incorporate these teachings.

What is claimed is:

1. Apparatus for estimating voltage on a wafer located in a process chamber said process chamber having at least one wall having an interior side, the apparatus comprising:

a conductive member disposed in the wall and not extending through the interior side of the wall, for detecting voltage levels generated by a plasma within said process chamber that are proportional to the estimated wafer voltage, the conductive member electrically insulated from said plasma; and a measuring equipment coupled to said conductive member for measuring the detected voltage levels.

2. The apparatus of claim 1 wherein the chamber wall contains a window in which the conductive member is disposed.

3. The apparatus of claim 2 wherein the window is fabricated from a dielectric material.

4. The apparatus of claim 3 wherein the window is quartz.

5. The apparatus of claim 3 wherein the window is alumina.

6. The apparatus of claim 1 wherein the conductive member is an electrode.

7. The apparatus of claim 6 wherein the electrode is copper.

8. The apparatus of claim 1 wherein the measuring equipment is a voltmeter.

9. The apparatus of claim 1 wherein the chamber wall further comprises:

a bore open to an interior volume of said process chamber;

a dielectric material disposed within said bore in which the conductive member is disposed.

10. The apparatus of claim 9 wherein the dielectric material is selected from the group consisting of quartz, alumina and polyetherimide.

11. The apparatus of claim 9 wherein the dielectric material is alumina.

12. The apparatus of claim 9 wherein the conductive member is an electrode.

13. The apparatus of claim 12 wherein the electrode is copper.

14. The apparatus of claim 9 wherein the measuring equipment is a voltmeter.

15. System for monitoring a DC bias voltage on a substrate during processing in a plasma processing chamber, comprising:

a dielectric material disposed in a wall of the chamber and positioned to be exposed to the plasma;

a conductive member embedded in said dielectric material and not extending through an interior side of the wall; and a voltage measurement device connected to said conductive member configured to measure a voltage level of the member, where the measured voltage is proportional to the bias voltage on the substrate.

16. System as in claim 15 in which the voltage measurement device measures the RF voltage oscillations of the plasma.

17. System as in claim 15 in which the ratio of the measured voltage to the bias voltage equals a proportionality constant that is a ratio of the capacitances existing in the chamber, the embedded conductive member, and the voltage measurement device.

18. System as in claim 15 in which the voltage measurement device comprises a voltmeter.

19. The system as in claim 15 wherein said dielectric material is selected from the group consisting of quartz, alumina and polyetherimide.

20. The system as in claim 15 wherein said dielectric material is disposed within a bore in said chamber wall.

21. System for estimating a voltage on a wafer located in a process chamber comprising:

a chamber wall defining an interior volume;

a dielectric material disposed in said chamber wall and exposed to said interior volume; and an electrode disposed within said dielectric and not extending into said interior volume, said electrode electrically connected to voltage measuring instrumentation for measuring voltage levels generated by a plasma within said process chamber, where the voltage detected by the electrode is proportional to the voltage on the wafer.

22. System as in claim 21 in which the voltage measurement instrumentation measures the RF voltage oscillations of the plasma.

23. System as in claim 21 in which the ratio of the measured voltage to the bias voltage equals a proportionality constant that is a ratio of the capacitances existing in the chamber, the electrode, and the voltage measurement instrumentation.

24. System as in claim 21 in which the voltage measurement instrumentation comprises a voltmeter.

25. The system as in claim 21 wherein said dielectric material is selected from the group consisting of quartz, alumina and polyetherimide.

26. The system as in claim 21 wherein said dielectric material is disposed within a bore in said chamber wall.

27. A method for monitoring DC bias voltage on a wafer during processing in a plasma processing chamber, the method comprising the steps of:

providing a conductive member embedded in a dielectric material exposed to the interior of the chamber, the conductive member not extending into the interior of the chamber; and measuring a voltage level of the conductive member, where the voltage level measured by the conductive member is proportional to the DC bias voltage on the wafer.

28. The method of claim 27 in which the dielectric material is provided within the wall of the chamber.

29. The method of claim 27 in which the proportionality between the DC bias voltage and the measured voltage is defined by a ratio of the capacitances existing in the chamber, the embedded conductive member, and a voltage measurement device used to measure the voltage level of the conductive member.

30. The method of claim 27 in which the dielectric and conductive member are provided in a location exposed to RF voltage oscillations of the plasma.

31. The method of claim 30 in which the voltage level of the conductive member is indicative of the RF voltage oscillations of the plasma.

32. The method of claim 31 in which the conductive member is provided with a size great enough to insure preferential detection of said RF voltage oscillations over background noise in the voltage level of the conductive member.

* * * * *

UNITED STATES PATENT AND TRADEMARK OFFICE
CERTIFICATE OF CORRECTION

PATENT NO.     : 6,356,097 B1                                              Page 1 of 1
DATED          : March 12, 2002
INVENTOR(S)    : Loewenhardt et al.

It is certified that error appears in the above-identified patent and that said Letters Patent is hereby corrected as shown below:

<u>Column 5,</u>
Line 16, please replace "C κ*A/d" with -- C ∝ κ*A/d --.

Signed and Sealed this

Tenth Day of September, 2002

Attest:

JAMES E. ROGAN
Attesting Officer        Director of the United States Patent and Trademark Office